US012613263B2

(12) United States Patent
Wendler et al.

(10) Patent No.: US 12,613,263 B2
(45) Date of Patent: Apr. 28, 2026

(54) MEASUREMENT INSTRUMENT FOR MEASURING RADIO FREQUENCY SIGNALS AND A MEASUREMENT METHOD

(71) Applicant: Rohde & Schwarz GmbH & Co. KG, Munich (DE)

(72) Inventors: Wolfgang Wendler, Munich (DE); Jens Franke, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 126 days.

(21) Appl. No.: 18/604,991

(22) Filed: Mar. 14, 2024

(65) Prior Publication Data

US 2025/0290961 A1    Sep. 18, 2025

(51) Int. Cl.
*G01R 29/08*        (2006.01)

(52) U.S. Cl.
CPC ................................ *G01R 29/0871* (2013.01)

(58) Field of Classification Search
CPC  G01R 29/0871; G01R 23/16; G01R 13/0254; H04B 17/00; H04B 17/318
See application file for complete search history.

(56) References Cited

U.S. PATENT DOCUMENTS

| | | | |
|---|---|---|---|
| 5,493,209 A | 2/1996 | Gumm et al. | |
| 7,352,827 B2 | 4/2008 | Earls et al. | |
| 9,291,646 B2 | 3/2016 | Dobyns et al. | |
| 10,698,004 B2 | 6/2020 | Reich et al. | |
| 2003/0208330 A1* | 11/2003 | Pickerd | G01R 13/345 |
| | | | 702/80 |
| 2005/0207512 A1* | 9/2005 | Earls | H04B 1/28 |
| | | | 375/316 |
| 2012/0032837 A1* | 2/2012 | Poprawa | G01R 27/28 |
| | | | 324/76.23 |
| 2012/0041701 A1* | 2/2012 | Hillman, Jr. | G01R 13/0254 |
| | | | 702/66 |
| 2013/0060527 A1* | 3/2013 | Martin | G01R 13/0254 |
| | | | 702/189 |
| 2013/0158923 A1* | 6/2013 | Stanton | G01R 13/0254 |
| | | | 702/76 |
| 2020/0044906 A1 | 2/2020 | Lagler et al. | |

FOREIGN PATENT DOCUMENTS

WO        2007/042600 A1      4/2007

* cited by examiner

*Primary Examiner* — Alvaro E Fortich
(74) *Attorney, Agent, or Firm* — CHRISTENSEN O'CONNOR JOHNSON KINDNESS PLLC

(57)                ABSTRACT

The present disclosure relates to a measurement instrument for measuring radio frequency signals. The measurement instrument is configured for analyzing a radio frequency signal received. The measurement instrument includes a measurement path configured for analyzing the radio frequency signal at a measurement frequency in a measurement bandwidth. The measurement instrument further includes a trigger path configured for signal detection at a trigger frequency in a trigger bandwidth. The trigger path is configured to trigger on the measurement path in the trigger bandwidth that is outside of the measurement bandwidth of the measurement path. Further, a measurement method is described.

19 Claims, 1 Drawing Sheet

MEASUREMENT INSTRUMENT FOR MEASURING RADIO FREQUENCY SIGNALS AND A MEASUREMENT METHOD

FIELD OF THE DISCLOSURE

Embodiments of the present disclosure generally relate to a measurement instrument for measuring radio frequency signals. Embodiments of the present disclosure further relate to a measurement method.

BACKGROUND

In the state of the art, measurement instruments, also called test instruments, are known that are used for performing measurements on radio frequency (RF) signals. For instance, spectral emission mask (SEM) measurements are performed that measure out-of-band emissions in neighboring bands of a certain carrier. In other measurements known in the state of the art, e.g. adjacent channel power measurements ("ACP" measurements), those emissions may remain undetected when measuring the integrated power in the band of the respective carrier. In particular, SEM measurements use a spectral mask or limit that can be set in order to measure a margin of the emission level from the limit.

When testing modern communication devices, broadband SEM measurements on a gated signal with power trigger may be desired, e.g. WLAN 802.11 ax or similar standards. The power trigger however does not trigger at the start of the SEM measurement since the power trigger is not associated with a bandwidth of a power detector used by the measurement instrument for performing the measurement.

To overcome this issue, complex measurement setups are necessary which requires high efforts when setting up the respective measurement setup and, therefore, the costs related to the measurements increase.

Accordingly, it is an object to provide a simple and cost-efficient possibility to perform those measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a measurement instrument for measuring radio frequency signal. The measurement instrument is configured for analyzing a radio frequency signal received. In an embodiment, the measurement instrument comprises a measurement path configured for analyzing the radio frequency signal at a measurement frequency in a measurement bandwidth. The measurement instrument further comprises a trigger path configured for signal detection at a trigger frequency in a trigger bandwidth. The trigger path is configured to trigger on the measurement path in the trigger bandwidth that is outside of the measurement bandwidth of the measurement path.

Embodiments of the present disclosure also provide a measurement method. In an embodiment, the method comprises the following: providing a measurement instrument for measuring radio frequency signals, wherein the measurement instrument comprises a measurement path configured for analyzing the radio frequency signal at a measurement frequency in a measurement bandwidth, wherein the measurement instrument further comprises a trigger path configured for signal detection at a trigger frequency in a trigger bandwidth; triggering, by the trigger path, on the measurement path in the trigger bandwidth that is outside of the measurement bandwidth of the measurement path; and performing a radio frequency measurement by the measurement path at the measurement frequency in the measurement bandwidth.

The main idea is to provide two separate and independent paths that are used to enable a trigger out of the evaluation range, namely out of the measurement bandwidth of the measurement path. Accordingly, one path is used for the measurement, namely the measurement path, and one path is used for triggering, namely the trigger path. A signal detection via the trigger path triggers a measurement via the measurement path. Hence, it is possible to trigger at the start of the respective measurement since the trigger is independent of the measurement path, for example with respect to the bandwidth. In other words, the measurement in a certain frequency band can be triggered by a signal in a completely different frequency band, thereby ensuring that the measurement is started in due time. Accordingly, the frequency range for triggering can be extended.

An aspect provides that the measurement frequency and the trigger frequency, for example, can be set independently to different values. Alternatively or additionally, the measurement bandwidth and the trigger bandwidth can be set independently to different values. In a certain operation mode, the measurement frequency and the trigger frequency are set independently to different values. Alternatively or additionally, the measurement bandwidth and the trigger bandwidth are set independently to different values in a certain operation mode. Hence, a user may set the respective frequencies or bandwidths manually. Alternatively, the frequencies or bandwidths may be set automatically by a testing routine performed. Depending on the specific application scenario, it might be desired to trigger the measurement by a signal in a frequency band directly adjacent to the frequency band to be evaluated. In other application scenarios however, the triggering shall be done in frequency bands located far away from the frequency band to be evaluated.

Another aspect provides that the trigger path, for example, is configured for providing a power trigger. Accordingly, a power of the signal processed by the trigger path is detected such that the triggering on the measurement path is done in case the power detected reaches or exceeds a trigger level associated with the trigger path.

According to a certain embodiment, the trigger frequency is outside of a bandwidth of a power detector located in the measurement path. The power detector is associated with the measurement path. The bandwidth of the power detector may be comparable small with respect to the trigger frequency used by the trigger path. Actually, the difference of the trigger frequency ($f\_1$) and the measurement frequency ($f\_2$) may be smaller than the bandwidth (BW) of the power detector. In other words, the frequency difference between the signal to be used for triggering, namely the trigger frequency, and the evaluation range (measurement bandwidth) can be wider than the analysis bandwidth of the measurement instrument, namely the bandwidth of the power detector. Since the trigger path and, thus, the trigger frequency is independent of the measurement path and, thus, the measurement frequency, it is nevertheless possible to capture the radio frequency signal by the measurement path.

Furthermore, the measurement instrument may be configured such that the trigger bandwidth for the trigger path can be set to a value smaller than the measurement bandwidth of the measurement path. In a certain operation mode, the trigger bandwidth for the trigger path is set to a value smaller than the measurement bandwidth of the measurement path. Hence, a narrowband triggering may be applied. In other words, the trigger path bandwidth can be very small to enable narrowband observation triggering. This improves the dynamic range of the power detection accordingly.

The measurement path and the trigger path may be located within a single housing of the measurement instrument. Hence, a single device is provided that encompasses both independent paths, namely the measurement path and the trigger path. In other words, neither the measurement path nor the trigger path is an external path, as both paths are internal paths of the same measurement instrument. Actually, a simplified measurement setup can be provided.

Another aspect provides, for example, independent radio frequency downconverters for the measurement path and the trigger path, respectively. Hence, a different (center) frequency can be set for the measurement path and the trigger path, respectively. A radio frequency downconverter particularly comprises a mixer that is connected to a corresponding local oscillator via which a local oscillator signal is received for down-converting the radio frequency signal respectively.

In an embodiment, the measurement instrument may comprise independent bandwidth filters for the measurement path and the trigger path, respectively. Thus, different bandwidths can be implemented for the measurement path and the trigger path, respectively. The respective bandwidth filters may be adjustable such that the bandwidths can be adapted.

In an embodiment, the measurement instrument may comprise independent analog-to-digital converters for the measurement path and the trigger path, respectively. Hence, the digitizing of the signals processed by the measurement path and the trigger path can be done separately with respect to each other. Actually, different analog-to-digital converters may be used that are suitable for the respective application, as the requirements are different for the measurement path and the trigger path.

In an embodiment, the radio frequency downconverters, the resolution bandwidth filters, and/or the analog-to-digital converters are also located within the same housing of the measurement instrument, e.g. in the single device.

According to an embodiment, the measurement instrument has a splitter connecting the measurement path and the trigger path to a common radio frequency input of the measurement instrument. The common radio frequency input may be provided at a front-end of the measurement instrument such that a single radio frequency signal is inputted which is split and forwarded to the measurement path and the trigger path independently of each other for further processing.

According to another embodiment, the measurement instrument has at least two separate radio frequency inputs for the measurement path and the trigger path, respectively. A first radio frequency input of the at least two separate radio frequency inputs is connected with the trigger path, whereas a second radio frequency input of the at least two separate radio frequency inputs is connected with the measurement path. Consequently, the first radio frequency input may be called trigger input, whereas the second radio frequency input may be called measurement input. Both radio frequency inputs may be located at a front-end of the measurement instrument.

In an embodiment, the measurement instrument may be a signal analyzer or a spectrum analyzer. Hence, the respective triggering operation by the independent paths can be provided in a signal analyzer or in a spectrum analyzer.

Generally, the measurement frequency may be a sweeping frequency over a specified frequency range in the measurement bandwidth. Hence, performing the radio frequency measurement may comprise sweeping the measurement frequency over a specified frequency range in the measurement bandwidth. The specified frequency range can be defined as a range from a start to a stop frequency or as a span around a center frequency. Therefore, the measurement can be done over the specified frequency range even though the measurement is triggered by a trigger frequency outside of the specified frequency range.

Generally, real-time measurements are possible with the measurement instrument and the measurement method. Accordingly, the respective real-time bandwidths of the paths or channels have to be considered, namely the real-time bandwidth of the measurement path/channel and the real-time bandwidth of the trigger path/channel. The real-time bandwidths may be narrower such that the trigger bandwidth is outside of the measurement bandwidth, e.g. the trigger frequency is outside of the measurement frequency.

In an embodiment, the radio frequency measurement may be a spectrum emission mask (SEM) measurement. Actually, the method and measurement instrument described above enable a broadband SEM measurement on a gated signal with power trigger. Actually, the extended frequency range for power trigger obtained ensures that the power trigger triggers at the start of the SEM measurement.

In an embodiment, the measurement frequency may sweep over the frequency range of a spectrum emission mask and wherein the trigger frequency is fixed. The measurement frequency may cover a certain frequency range while sweeping such that out-of-band emissions in neighboring bands may be detected. The separate and independent trigger path ensures that the SEM measurement is started in time.

In an embodiment, the radio frequency measurement may be a spurious emissions measurement. In a similar manner, spurious emissions may be detected wherein it is ensured that the measurement is started in due time due to the extended frequency range for the power triggering. Actually, emissions caused by unwanted transmitter effects can be detected in a reliable manner due to the extended frequency range used for the triggering. A radiated signal outside of a transmitter's assigned channel is an example of a spurious emission.

In an embodiment, the radio frequency measurement may be a harmonic distortion measurement. Moreover, harmonic distortions may be detected as well wherein it is ensured that the measurement is started in due time due to the extended frequency range for the power triggering.

Regarding the advantages and further properties of the electronic device, reference is made to the explanations given above with respect to the test instrument and the method, which also hold for the electronic device and vice versa.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
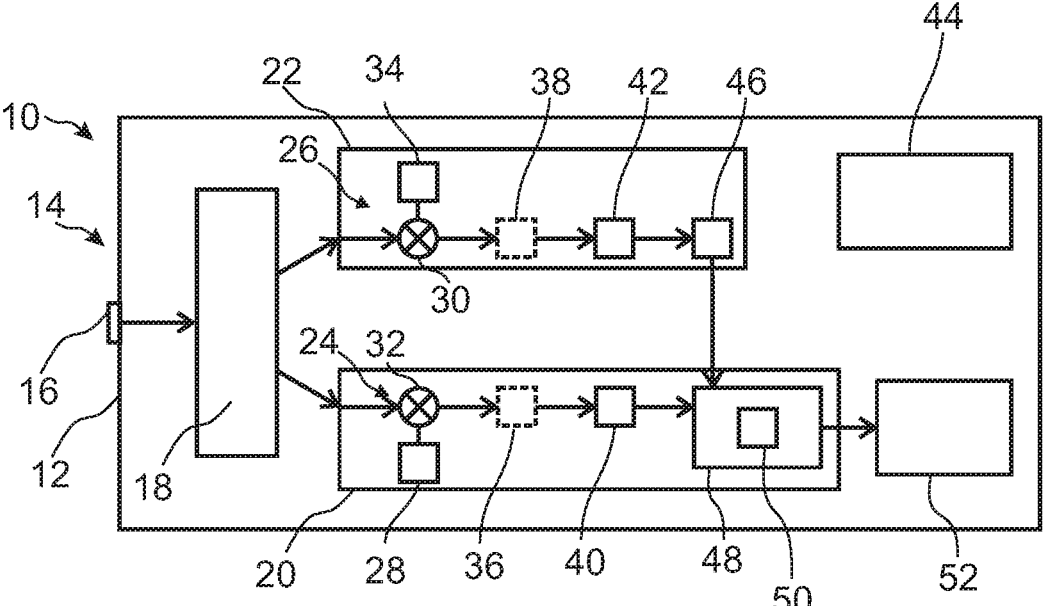
FIG. 1 schematically shows a measurement instrument according to a an embodiment of the present disclosure, and FIG. 2 schematically shows a measurement instrument according to a another embodiment of the present disclosure.

FIG. 1 schematically shows an example of a measurement instrument 10 for measuring radio frequency signals. As shown in FIG. 1, the measurement instrument 10 has a housing 12 with a front-end 14 at which a single radio frequency input 16 is provided for receiving the radio frequency signals to be measured.

The single radio frequency input 16 is connected to a splitter 18 that is encompassed by the housing 12. The splitter 18 is connected to a measurement path 20 and a trigger path 22. The measurement path 20 is configured for analyzing the radio frequency signal received at a measurement frequency in a measurement bandwidth, whereas the trigger path 22 is configured for signal detection at a trigger frequency in a trigger bandwidth.

In the embodiment shown, the measurement path 20 and the trigger path 22 both comprise a radio frequency down-converter 24, 26 having a mixer 28, 30. The respective mixers 28, 30 receive a local oscillator signal from a corresponding local oscillator 32, 34 such that the radio frequency signal received via the input 16 is down-converted accordingly. Optionally, filters 36, 38 are provided in the measurement path 20 and the trigger path 22 respectively, as indicated by the dashed lines in FIG. 1. In an embodiment, the measurement path 20 and the trigger path 22 both comprise an analog-to-digital converter (ADC) 40, 42 which digitize the (down-converted) signals processed by measurement path 20 and the trigger path 22 respectively.

The respective components, namely the radio frequency downconverters 24, 26, the mixers 28, 30, the local oscillators 32, 34, the filters 36, 38, and the analog-to-digital converters 40, 42 are located within the housing 12 of the measurement instrument as shown in FIG. 1. Moreover, these components are independent of each other. This ensures that different bandwidths and/or different center frequencies for the signals are processed in the measurement path 20 and the trigger path 22 respectively. In an embodiment, the components mentioned above may be set by a user, for instance via a user interface 44 of the measurement instrument 10.

Both paths, namely the measurement path 20 and the trigger path 22, further distinguish from each other by their purpose as indicated above. In an embodiment, the trigger path 22 comprises a trigger circuit 46 that is used to trigger on the measurement path 20, namely a measurement by a measurement circuit 48. The trigger circuit 46 itself may also relate to a power trigger such that a trigger event is detected in case the power level of the signal processed in the trigger path 22 reaches or exceeds a certain level, namely a trigger level.

Since different bandwidths and/or different center frequencies may be set for the measurement path 20 and the trigger path 22, the measurement instrument 10 generally ensures that the trigger path 22 is configured to trigger on the measurement path 20 in a trigger bandwidth that is outside of a measurement bandwidth of the measurement path 20. In other words, the trigger path 22 may be associated with a certain frequency band, whereas the measurement path 20 is associated with a different frequency band, which can be ensured by the different bandwidths and/or different center frequencies.

Therefore, a trigger event in the certain frequency band that is analyzed by the trigger path 22 triggers the measurement in the measurement path 20 on a different frequency band. Hence, the frequency range for the triggering can be extended accordingly, as the trigger path 22 and the measurement path 20 are independent of each other.

As indicated above, the respective components associated with the measurement path 20 and the trigger path 22 are independent of each other. Hence, the measurement frequency and the trigger frequency and/or the measurement bandwidth and the trigger bandwidth can be set independently to different values.

In an embodiment, a power measurement may be triggered by the trigger path 22, for example the trigger circuit 46. The power measurement may be done by a power detector 50 that is associated with the measurement path 20. The power detector 50 also has a bandwidth that might limit the characteristics of the measurement instrument 10. Since the trigger path 22 is independent of the measurement path 20 and, thus, the power detector 50 located in the measurement path 20, the trigger frequency may be outside of the bandwidth of the power detector 50.

Generally, the trigger bandwidth for the trigger path 22 can be set to a value smaller than the measurement bandwidth of the measurement path 20, for instance by the filter(s) 36, 38. In other words, a narrowband bandpass filter may be used in the trigger path 22 such that the trigger path 22 or the trigger channel is relatively narrow compared to the measurement path 20 or the measurement channel.

In an embodiment, the measurement instrument 10 further comprises an acquisition circuit 52 that is connected to the measurement circuit 48. The measured signals are acquired by the acquisition circuit 52, for example for further processing.

Figure 2:
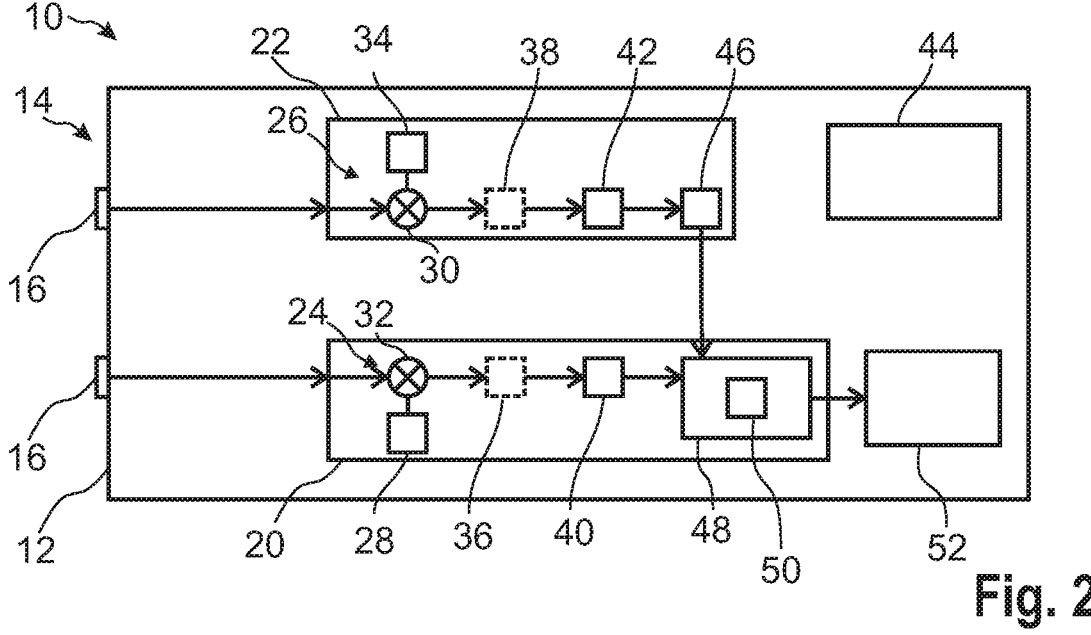

In FIG. 2, another embodiment is shown that distinguishes from the one shown in FIG. 1 in that two radio frequency inputs 16 are provided at the front-end 14, which are directly connected to the measurement path 20 and the trigger path 22, respectively. Hence, the splitter 18 of FIG. 1 is omitted in the embodiment of FIG. 2, as the first radio frequency input 16 is directly connected with the measurement path 20, whereas the second radio frequency input 16 is directly connected with the trigger path 22. Consequently, the first radio frequency input 16 may relate to a measurement input, whereas the second radio frequency input 16 may relate to a trigger input.

Due to the different radio frequency inputs 16, the trigger path 22 may receive a radio frequency signal that is different to the one forwarded to the measurement path 20. Therefore, different trigger conditions could be applied by this embodiment of the measurement instrument.

Generally, the measurement instrument 10 can be a signal analyzer or a spectrum analyzer. Consequently, the respective measurements performed by the measurement instrument 10 may be a spectrum emission mask measurement, a spurious emissions measurement and/or a harmonic distortion measurement.

In an embodiment, the measurement frequency may sweep over a frequency range of a spectrum emission mask. In other words, the measurement frequency is swept over a specified frequency range in the measurement bandwidth when performing the radio frequency measurement. The trigger frequency however may be fixed during the respective measurement. In an embodiment, the the trigger frequency can be in a different frequency band than the measurement frequency, namely the frequency range over which the measurement frequency is swept.

In any case, the measurement instrument 10 is enabled to perform a radio frequency signal measurement. In an embodiment, the trigger path 22 triggers on the measurement path 20 in the trigger bandwidth that is outside of the measurement bandwidth of the measurement path 20. This causes the measurement path 20 to perform a radio frequency measurement at the measurement frequency in the measurement bandwidth. As indicated above, this ensures that measurements on frequency ranges can be performed that are different to the ones used for triggering.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

In an embodiments, one or more of the components of the the measurement instrument 10 include circuitry programmed to carry out one or more steps of any of the methods disclosed herein. In an embodiments, one or more computer-readable media associated with or accessible by such circuitry contains computer readable instructions embodied thereon that, when executed by such circuitry, cause the component or circuitry to perform one or more steps of any of the methods disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In some embodiments, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

Although the method and various embodiments thereof have been described as performing sequential steps, the claimed subject matter is not intended to be so limited. As nonlimiting examples, the described steps need not be performed in the described sequence and/or not all steps are required to perform the method. Moreover, embodiments are contemplated in which various steps are performed in parallel, in series, and/or a combination thereof. As such, one of ordinary skill will appreciate that such examples are within the scope of the claimed embodiments.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement instrument for measuring radio frequency signals, wherein the measurement instrument is configured for analyzing a radio frequency signal received, wherein the measurement instrument comprises a measurement path configured for analyzing the radio frequency signal at a measurement frequency in a measurement bandwidth, and a trigger path configured for signal detection at a trigger frequency in a trigger bandwidth, and wherein the trigger path is configured to trigger on the measurement path in the trigger bandwidth that is outside of the measurement bandwidth of the measurement path.

2. The measurement instrument according to claim 1, wherein the measurement frequency and the trigger frequency and/or the measurement bandwidth and the trigger bandwidth can be set independently to different values.

3. The measurement instrument according to claim 1, wherein the trigger path is configured for providing a power trigger.

4. The measurement instrument according to claim 1, wherein the trigger frequency is outside of a bandwidth of a power detector located in the measurement path.

5. The measurement instrument according to claim 1, wherein the measurement instrument is configured such that the trigger bandwidth for the trigger path can be set to a value smaller than the measurement bandwidth of the measurement path.

6. The measurement instrument according to claim 1, wherein the measurement path and the trigger path are located within a single housing of the measurement instrument.

7. The measurement instrument according to claim 1, further comprising independent radio frequency downconverters for the measurement path and the trigger path, respectively.

8. The measurement instrument according to claim 1, further comprising independent bandwidth filters for the measurement path and the trigger path, respectively.

9. The measurement instrument according to claim 1, further comprising independent analog-to-digital converters for the measurement path and the trigger path, respectively.

10. The measurement instrument according to claim 1, further comprising a splitter connecting the measurement path and the trigger path to a common radio frequency input of the measurement instrument.

11. The measurement instrument according to claim 1, further comprising at least two separate radio frequency inputs for the measurement path and the trigger path, respectively.

12. The measurement instrument according to claim 1, wherein the measurement instrument is a signal analyzer or a spectrum analyzer.

13. A measurement method comprising:

providing a measurement instrument for measuring radio frequency signals, wherein the measurement instrument comprises a measurement path configured for analyzing the radio frequency signal at a measurement frequency in a measurement bandwidth, wherein the measurement instrument further comprises a trigger path configured for signal detection at a trigger frequency in a trigger bandwidth;

triggering, by the trigger path, on the measurement path in the trigger bandwidth that is outside of the measurement bandwidth of the measurement path; and performing a radio frequency measurement by the measurement path at the measurement frequency in the measurement bandwidth.

14. The method according to claim 13, wherein performing the radio frequency measurement comprises sweeping the measurement frequency over a specified frequency range in the measurement bandwidth.

15. The method according to claim 14, wherein the measurement frequency and the trigger frequency and/or the measurement bandwidth and the trigger bandwidth can be set independently to different values.

16. The method according to claim 13, wherein the radio frequency measurement is a spectrum emission mask measurement.

17. The method according to claim 16, wherein the measurement frequency sweeps over the frequency range of a spectrum emission mask and wherein the trigger frequency is fixed.

18. The method according to claim 13, wherein the radio frequency measurement is a spurious emissions measurement.

19. The method according to claim 13, wherein the radio frequency measurement is a harmonic distortion measurement.

* * * * *